United States Patent [19]

Avery

[11] Patent Number: 4,631,562
[45] Date of Patent: Dec. 23, 1986

[54] ZENER DIODE STRUCTURE

[75] Inventor: Leslie R. Avery, Hunterdon County, N.J.

[73] Assignee: RCA Corporation, Princeton, N.J.

[21] Appl. No.: 739,820

[22] Filed: May 31, 1985

[51] Int. Cl.[4] .......................................... H01L 29/90
[52] U.S. Cl. ...................................... 357/13; 357/20; 357/21; 357/48
[58] Field of Search ........................ 357/13, 20, 21, 48

[56] References Cited

U.S. PATENT DOCUMENTS

| 3,581,164 | 5/1971 | Pfander et al. | 317/234 |
| 3,881,179 | 4/1975 | Howard | 357/13 |
| 4,136,349 | 1/1979 | Tsang | 357/13 |
| 4,213,806 | 7/1980 | Tsang | 148/187 |
| 4,405,933 | 9/1983 | Avery | 357/13 |
| 4,429,324 | 1/1984 | Wilkens | 357/13 |
| 4,441,114 | 4/1984 | Muggli | 357/13 |
| 4,484,206 | 11/1984 | Moroshima et al. | 357/13 |

FOREIGN PATENT DOCUMENTS 59-13379   1/1984   Japan .............................. 357/13 Z Primary Examiner—Martin H. Edlow
Assistant Examiner—Terri M. Henn
Attorney, Agent, or Firm—Birgit E. Morris; Donald S. Cohen; James M. Trygg

[57] ABSTRACT

A zener diode structure for integrated circuits is disclosed. The device includes a pair of parallel zener diodes connected back to back with a third zener diode. The anode of one of the parallel diodes is connected to the anodes of the other two diodes through a parasitic resistance. The zener breakdown junctions of two of the diodes are well below the surface of the device thereby reducing any adverse affect of stray surface charges and ultraviolet radiation. Further, the doping levels of the opposing diodes are selected to reduce drift in the breakdown voltage due to variations in operating temperature of the device.

7 Claims, 2 Drawing Figures

ZENER DIODE STRUCTURE

This invention relates to a temperature compensated buried zener diode structure for use in integrated circuit devices.

BACKGROUND OF THE INVENTION

The term zener diode has long been applied to two electrode semiconductor devices operating with respect to the phenomena of the breakdown in semiconductor junctions below approximately 5 volts and of the avalanche effect in such materials at potentials above approximately 5 volts. Zener diode devices are widely used as potential or voltage regulating devices particularly in reference potential generating circuitry. Conventional integrated circuit devices frequently include a number of zener diode devices, a number of transistor devices and auxiliary circuit components and connections on a single semiconductor wafer or chip. Such zener diodes used in these applications have very accurately determined and reproducable zener breakdown voltages. There have been problems, however, associated with these prior art devices usually related to avalanche breakdown at the surface of the device. This is often manifested by drift of the breakdown voltage, for example, as a function of time with changes in temperature. In an effort to improve these devices, zener diodes have been developed with subsurface breakdown junctions. Although such structures experience reduced breakdown at the surface, voltage drift with changes in temperature still remains a problem. There is a present need for an improved integrated circuit zener diode having superior stability and improved drift characteristics through a wide range of temperature applications.

SUMMARY OF THE INVENTION

According to the present invention there is shown a temperature compensating buried zener diode device having a substrate of first conductivity type semiconductor material. A first layer of a second conductivity type semiconducting material having a surface is disposed on the substrate. A second layer of highly doped second conductivity type semiconducting material is arranged intermediate a portion of the substrate and the first layer. A first region of first conductivity type is disposed within and in PN junction forming relation with the first layer and extends downwardly from the surface directly opposed but not in contact with one end of the second layer. A second region of highly doped second conductivity type extends downwardly from the surface entirely within the first region and as in PN junction forming relation with the first region at an interface therebetween thereby forming a first zener breakdown junction at the interface. A third region of highly doped first conductivity type is arranged in the first layer, in PN junction forming relation with the second region along a portion of the interface directly opposed to the second layer. A second zener breakdown junction is thereby formed at the portion of the interface. The third region extends downwardly through both the first region and the first layer and into PN junction forming relation with one end of the second layer thereby forming a third zener breakdown junction therebetween.

DESCRIPTION OF THE PREFERRED EMBODIMENTS

Figure 1:
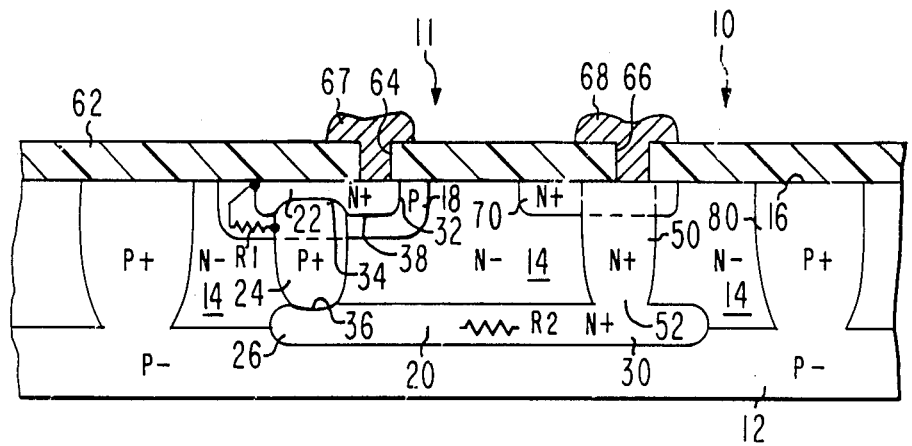
FIG. 1 is a cross sectional view of a portion of an integrated circuit device embodying the teachings of the present invention.

There is shown in FIG. 1 a portion of an integrated circuit device 10 having a temperature compensated zener diode structure, or device 11 formed therein. The device 10 includes a substrate 12 of a first conductivity type material, which is lightly doped P type in the present example. An epitaxial layer 14 of a second conductivity type material, which is lightly doped N type, is disposed over the substrate 12. The layer 14 includes a planar surface 16 on a side opposite that of the substrate 12. The zener diode structure 11 includes a first region 18 of first conductivity type material which is moderately doped P type and having a resistance of from about 150 to 250 ohms per square and is disposed in PN junction forming relation with the layer 14. A second semiconductor layer 20 of second conductivity type material and being highly doped N type is disposed intermediate a portion of the substrate 12 and the first layer 14. One end 26 of the second layer 20 is arranged directly below the region 18. A second region 22 of second conductivity type material of highly doped N type extends downwardly from the surface 16 and is arranged in PN junction forming relation with the first region 18 thereby forming a first zener breakdown junction 32 at the surface 16 as shown in FIG. 1. The first zener breakdown junction 32 is a parasitic diode which is formed as a result of the presence of the first region 18. While there are significant advantages gained by use of the first region 18, potential adverse effects of the parasitic diode are avoided as more fully described below. A third region 24 of first conductivity type material of highly doped P type, is arranged in PN junction forming relation with the second region 22 and forms a second zener breakdown junction 34 well below the surface 16. The third region 24 extends downwardly through the region 18 and first layer 14 into PN junction forming relation with the end 26 of the second layer 20 thereby forming a third zener breakdown junction 36. As is shown in FIG. 1, the second region 22 is arranged completely within the region 18 and includes a lower surface 38 which substantially surrounds the zener breakdown junction 34 and is somewhat deeper with respect to the surface 16. The third region 24 has a resistance of from about 2 to 30 ohms per square near the surface 16.

The purpose of the first region 18 is to provide electrical isolation between the N− layer 14 and the N+ region 22. If the region 18 were not present, and instead, the P+ region 24 were made wide enough to isolate the region 22, the region 22 would necessarily be so thin that there would be a substantial risk that any metalization that would be subsequently formed in ohmic contact with the region 22 would penetrate through to the region 24. This, of course would short the diode junction 34. Further, such a structure would result in a lateral surface breakdown which is a problem that is well known in the art.

The zener breakdown junction 32 differs from the buried zener breakdown junction 34 in that the breakdown occurs at the surface due to inherently higher doping levels there. Such diode structures, which are well known in the art, are frequently subject to breakdown voltage drift. Most importantly, however, the breakdown voltage of the zener breakdown junction 32 is substantially higher than that of the zener breakdown junction 34. This is assured because the P type concentration of the third region 24 adjacent the second region 22 is greater than the P type concentration of the first region 18 at the surface 16. This higher breakdown voltage effectively prevents the zener breakdown junction 32 from reaching a sufficiently high voltage level to become conductive thereby rendering it passive. Therefore, the advantages gained by use of the first region 18 in the zener diode 11 are not compromised by the existance of the parasitic first zener breakdown junction 32.

A fourth region 50 of second conductivity type material of highly doped N type extends downwardly from the surface 16, through the first layer 14 and into electrical communication with the other end 30 of the second layer 20. That is, the fourth region 50 is made to intersect the second layer 20 at the end 30. The second layer 20 and the fourth region 50 are both doped so that they have a resistance of from about 20 to 50 ohms per square.

An insulating layer 62, which may be for example silicon dioxide, overlies the surface 16. A contact opening 64 is arranged directly over the second region 22 but offset so that it is not directly over the zener breakdown junction 36 as shown in FIG. 1. This assures that a metal contact subsequently formed in the opening 64 will be directly over the somewhat thicker portion of the region 22 which surrounds the zener breakdown junction 36. Another contact opening 66 is arranged over the fourth region 50. A terminal or conductor 67, comprising the cathode of the zener diode 11, is arranged in ohmic contact with the second region 22 through the opening 64 as shown in FIG. 1. Another terminal or conductor 68, comprising the anode of the zener diode 11, is arranged in ohmic contact with the fourth region 50 at the surface 16 as shown in FIG. 1.

A variation of the ohmic contact between the conductor 68 and the fourth region 50 may include a fifth region 70 of highly doped N type conductivity material having a resistance of from about 2 to 20 ohms per square interposed therebetween. This fifth region 70 may be formed concurrently with the forming of the second region 22 without departing from standard manufacturing processes and without additional processing steps. There is a substantial advantage realized by use of the fifth region 70 in that the thickness of the layer 62, which is usually oxide, over the regions 50 and 22 will be substantially the same. This results in substantially identical etch times for etching the contact openings 64 and 66. Without the fourth region 70 the thickness of the oxide layer 62 would be substantially greater over the region 50 than over the region 22.

Figure 2:
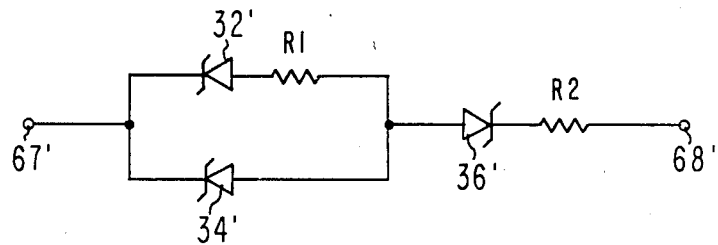
FIG. 2 is a schematic diagram illustrating the electrical circuit of the device of FIG. 1.

FIG. 2 shows a circuit diagram of the temperature compensated zener diode structure 11. The cathode terminal 67' and anode terminal 68' of FIG. 2 correspond to the two conductors 67 and 68 respectively, shown in FIG. 1. The zener diode 32' of FIG. 2 is the zener junction 32 which is formed at the interface between the first and second regions 18 and 22 as shown in FIG. 1. Similarly, the zener diode 36' of FIG. 2 is the zener junction 36 which is formed at the interface between the second layer 20 and the third region 24, and the zener diode 34' is the zener junction 34 at the interface between the second and third regions 22 and 24 as shown in FIG. 1. The parasitic resistor R2 interconnects the cathode of the zener junction 36' and the conductor 68 and represents the portion of the layer 20 which lies between the area 52 and the zener junction 36, as best seen in FIG. 1. Similarly, the parasitic resistor R1 interconnects the anode of the zener diode 32' and the anodes of the other two diodes 34' and 36'. This resistance represents the portion of the first region 18 that is adjacent the second region 22, as indicated in FIG. 1 by the resistor symbol R1.

It will be appreciated by those skilled in the art that the two zener breakdown junctions 34 and 36 are both well below the surface 16 of the device 11 and, therefore, avoid the problems commonly associated with zener junctions which extend to the surface. Additionally, for this reason, these zener junctions are less susceptible to strong surface charges and ultraviolet radiation. This, of course, is a substantial advantage when utilizing this type of zener diode in certain applications where ultraviolet radiation is present and stray surface charges are difficult to control. To further improve performance the zener diode structure 11 may be isolated from other devices on the integrated circuit 10 by forming highly doped P type regions 80 which completely surround the structure 11 and extend from the surface 16 downwardly into contact with the P type substrate 12. Such structures and the methods of making them are well known in the art.

A further advantage of this structure is that the two opposing zener diodes 34' and 36', of FIG. 2, may be arranged so that the zener diode 36' offsets a substantial portion of the breakdown voltage increase or decrease which commonly occurs in the zener diode 34' due to variations in operating temperature of the device. This occurs because the zener diode 34' has a positive temperature coefficient, that is its breakdown voltage increases with increasing temperature, and the zener diode 34', being used in its forward biased mode, has a negative temperature coefficient. By a suitable choice of doping levels, it is possible to achieve temperature compensation to a significant degree by the resulting reduction in the positive temperature coefficient of the zener diode 34'.

I claim:

1. A temperature compensating buried zener diode device comprising:
    (a) a substrate of a first conductivity type semiconductor material;
    (b) a first layer of a second conductivity type semiconductor material disposed on said substrate and having a surface;
    (c) a second layer of highly doped second conductivity type semiconductor material intermediate a portion of said substrate and said first layer;
    (d) a first region of first conductivity type diposed within and in PN junction forming relation with said first layer and extending downwardly from said surface directly opposed but not in contact with one end of said second layer;
    (e) a second region of highly doped second conductivity type extending downwardly from said surface entirely within said first region and being in PN junction forming relation with said first region at an interface therebetween and forming a first zener breakdown junction at said interface;
    (f) a third region of highly doped first conductivity type in said first layer, said third region being in PN junction forming relation with said second region along a portion of said interface directly opposed said second layer thereby forming a second zener breakdown junction therebetween, said third region extending through both said first region and said first layer and into PN junction forming relation with said one end of said second layer thereby forming a third zener breakdown junction threebetween; and (g) a fourth region of second conductivity type in said first layer extending downwardly from said surface into electrical contact with another end of said second layer.

2. The device set forth in claim 1 wherein said first region is of P type conductivity material having an electrical resistance of from about 150 to 250 ohms per square.

3. The device set forth in claim 2 wherein said second and fourth regions and said second layer are of N type conductivity material having an electrical resistance of from about 2 to 20 ohms per square.

4. The device set forth in claim 3 wherein said third region is of P type conductivity material having a resistance of from about 2 to 30 ohms per square.

5. The device set forth in claim 4 including a first terminal in ohmic contact with said second region, said first terminal comprising a cathode of said device.

6. The device set forth in claim 5 including a second terminal in ohmic contact with said fourth region, said second terminal comprising an anode of said device.

7. The device set forth in claim 6 including a fifth region of N type conductivity interposed between said second terminal and said fourth region, said fifth region having a resistance of from about 20 to 50 ohms per square.

* * * * *